United States Patent [19]

Yagoura et al.

[11] Patent Number: 4,826,068

[45] Date of Patent: May 2, 1989

[54] OUTER LEAD BONDING DEVICE UTILIZING TAPE CARRIERS

[75] Inventors: Hideya Yagoura; Haruo Shimamoto, both of Itami, Japan

[73] Assignee: Mitsubishi Denki Kabushiki Kaisha, Japan

[21] Appl. No.: 210,083

[22] Filed: Jun. 22, 1988

[30] Foreign Application Priority Data

Jun. 23, 1987 [JP] Japan ................. 62-157077

[51] Int. Cl.[4] ............................... B23K 1/20
[52] U.S. Cl. .................... 228/5.1; 228/6.2; 228/15.1; 228/44.7; 29/835
[58] Field of Search ............ 228/5.1, 6.2, 15.1, 228/44.7, 106, 179, 180.2; 29/835

[56] References Cited

U.S. PATENT DOCUMENTS 4,378,902  4/1983  Fedak ..................... 228/6.2

FOREIGN PATENT DOCUMENTS 287135  12/1986  Japan ..................... 228/6.2

Primary Examiner—Nicholas P. Godici
Assistant Examiner—Samuel M. Heinrich
Attorney, Agent, or Firm—Leydig, Voit & Mayer

[57] ABSTRACT

A bonding device for effecting outer lead bonding is disclosed which comprises a bonding stage, a pair of bonding tools, and lead supporting means. The lead supporting means may take the form of a pair of projections formed on the upper surface of the bonding stage at horizontal locations thereof which are situated below the lead supporting portion of the tape carrier. Alternatively, the lead supporting means may take the form of a pair of horizontally extending rectangular columns which are retractably inserted into the above specified horizontal locations of the upper surface of the bonding stage. Thus, leads can be formed simultaneously with the outer lead bonding. The bonding stage may be divided into upper and lower stages, and the projections may be formed on the upper surface of the lower stage to extend through holes formed in the upper stage. This structure makes the projections retractable.

6 Claims, 2 Drawing Sheets

OUTER LEAD BONDING DEVICE UTILIZING TAPE CARRIERS

BACKGROUND OF THE INVENTION

1. Field of the Invention

This invention relates to devices for effecting outer lead bonding in a tape automated bonding process, and more particularly to such devices which are capable of effecting lead forming simultaneously with the outer lead bonding.

2. Description of the Prior Art

In recent years, the tape automated bonding process utilizing tape carriers is replacing the wire bonding method in an increasing areas of applications as a technique for making electrical connections of the electrodes of semiconductor chips such as integrated circuits or transistors, for the tape automated bonding method has many advantages over the wire bonding method, such as the mass productivity thereof. In this tape automated bonding process, the semiconductor chips are first bonded to the patterns of leads carried by a carrier tape of a flexible material in the inner lead bonding process. In certain areas of applications, the leads and the semiconductor chips thus bonded together in the inner lead bonding process are then bonded to lead frames or substrates of printed circuits in the outer lead bonding process. FIGS. 1 and 2 show such outer lead bonding process effected by conventional devices.

The bonding device of FIG. 1 comprises a bonding stage 1 and a pair of bonding tools 2. The semiconductor chip 6, which has bumps 6a, i.e., projecting electrodes for making electrical connections, is bonded to the inner lead portions 4a of the leads 4 supported by the lead supporting portion 3 of the carrier tape. In the outer lead bonding process, the leads 4 bonded to the semiconductor chip 6 in the previous inner lead bonding process are bonded, for example, to a lead frame 5 by the bonding device. More precisely, the outer lead portions 4b of the leads 4 are bonded to the inner lead portions 5a of the leads of the lead frame 5 having a die pad in a center of each pattern of leads, on which the semiconductor chip 6 is positioned and bonded. The outer lead bonding is effected by lowering the bonding tools 2 to bond the outer lead portions 4b of the leads 4 and the inner lead portions 5a of the lead frame 5 by the thermocompression method.

Before the outer lead bonding as described above, however, the leads 4 must be formed into a step form; the reason therefor is as follows. As the upper surface of the bonding stage 1 is flat, the upper surface of the inner lead portions 5a of the leads of the lead frame 5 are sunk below the portions of the leads carried by the tape carrier 3 by a height G. Due to this level drop G of the upper surface of the inner lead portions 5a of the leads of the lead frame 5 with respect to the portions of the leads 4 near the bumps 6a on the upper surface of the chip 6, it is necessary to form the leads 4 substantially into step forms as shown in the figure before the outer lead bonding process.

In the case of the device of FIG. 2, the bonding stage has a recess 1b so that the above described level drop G is small. Thus, the forming of the leads 4 before the outer lead bonding are not necessary. However, due to the existence of the recess 1b, it becomes necessary to bend the lead frames so that the die pad portions 5b are sunk with respect to the inner lead portions 5a of the leads thereof by a level difference corresponding to the depth of the recess 1b of the stage 1.

Thus, the conventional bonding devices shown in FIGS. 1 and 2 have the following disadvantages. In the case of the device of FIG. 1, lead forming should be performed before the outer lead bonding, especially in the case in which the level drop G is great. Thus, an additional step of lead forming becomes necessary for which expensive dies for forming leads are necessary. In the case of the device of FIG. 2, the additional step of forming the lead frames to bend the lead frames so that the die pad portions 5b are sunk below the inner lead portions 5a of the leads thereof.

SUMMARY OF THE INVENTION

Thus, an object of the present invention is to provide a bonding device which is capable of effecting outer lead bonding of the semiconductor chips in one simple process of low cost. Another more particular object of the present invention is to provide a bonding device which is capable of effecting outer lead bonding without an additional step of lead forming or of the forming of the die pad portions of the lead frames.

The above objects are accomplished by the bonding device according to the present invention which comprises a bonding stage, a bonding tool and lead supporting and forming means. The bonding stage has an upper surface on which the connection member is supported. The examples of connection members include lead frames or substrates of printed circuits for assembling hybrid integrated circuits. The semiconductor chips are bonded thereto in the outer lead bonding process. The bonding tool is disposed above the upper surface of the bonding stage at a horizontal location at which the outer lead bonding is effected. The bonding tool may be any one of conventional bonding tools such as those that effect bonding by the thermocompression method. The lead supporting and forming means, which may be realized in the form of projections on the bonding stage or, alternatively, in the form of retractably insertable horizontally extending rectangular columns sliding on the upper surface of the bonding stage in the longitudinal direction thereof, supports the middle portions of the leads through the lead supporting portion of the tape carrier at a predetermined height from the upper surface of the bonding stage, when the bonding tool is lowered to effect the outer lead bonding.

BRIEF DESCRIPTION OF THE PREFERRED EMBODIMENTS

Further details of the present invention will become more clear in the following detailed description of the preferred embodiments, taken in conjunction with the attached drawings, in which.

In the drawings, like reference numerals represent like or corresponding parts or elements.

DETAILED DESCRIPTION OF THE PREFERRED EMBODIMENTS

Figure 1:
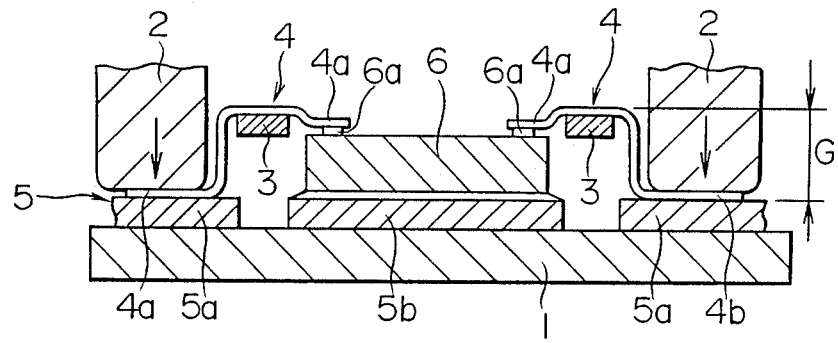
FIG. 1 is a partial sectional view of a conventional bonding device, showing the device in elevation effecting the outer lead bonding process in which a semiconductor chip bonded to the leads carried by a tape carrier is bonded to a lead frame.
Figure 2:
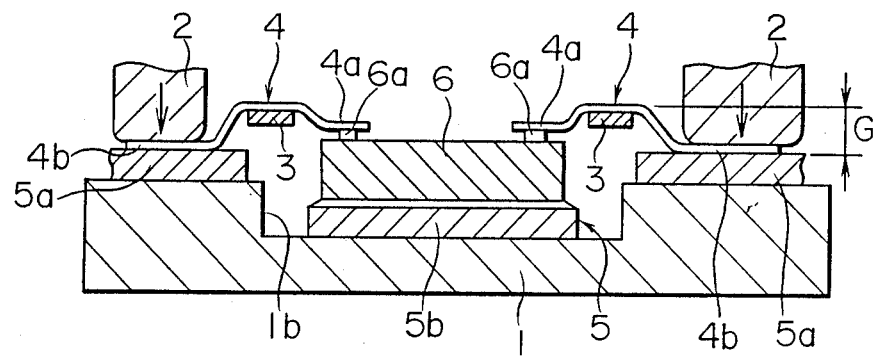
FIG. 2 is a view similar to that of FIG. 1, but showing another conventional bonding device.
Figure 3:
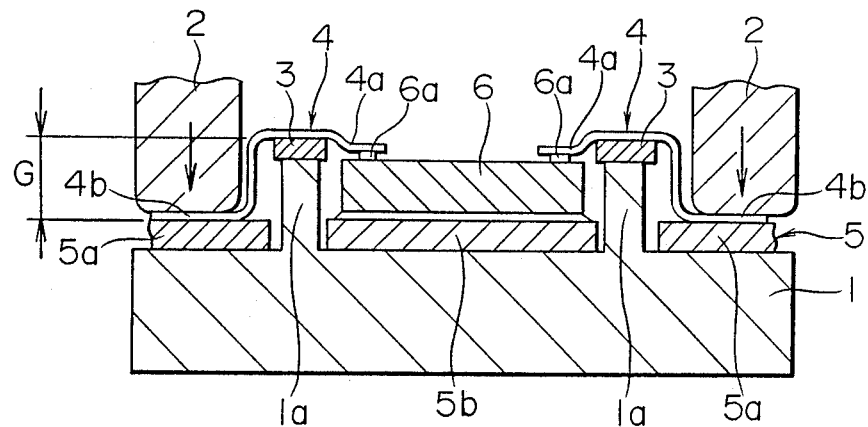
FIG. 3 is also a view similar to that of FIG. 1, but showing a bonding device according to the present invention.

Referring now to FIGS. 3 of the drawings, a first embodiment of the present invention is described.

The device shown in FIG. 3 for effecting outer lead bonding of semiconductor chips comprises a bonding stage 1 and a pair of bonding tools 2. The bonding stage 1 has a pair of projections 1a projecting from the upper surface of the stage 1 to a predetermined height to support a portion of a tape carrier 3 supporting the leads 4. The bonding tools 2 are movable in vertical direction, and are lowered against the outer lead portions 4b of the leads 4. The tools 2 may be conventional constant temperature thermodes which effect outer lead bonding by thermocompression.

The device of FIG. 3 may be utilized in an outer lead bonding process in which the outer lead portions 4b of the leads 4 are bonded to inner lead portions 5a of the leads of the lead frame 5 (partial cross section of which is shown in the figure). The lead frame 5 utilized in such process consists of an elongated metallic plate in which repeating patterns of a die pad 5b and surrounding leads (having inner lead portions 5a) are formed.

The carrier tape utilized in the outer led bonding effected by the device of FIG. 3 consists of an elongated tape-shaped film of a flexible material such as polyimide, in which repeating patterns of apertures for receiving the semiconductor chips 6 and for effecting the outer lead bonding process are formed at a predetermined intervals in the longitudinal directions thereof. A pattern of leads of metallic material such as copper is formed over each pattern of apertures of the tape carrier to surround the central aperture approximately radiating therefrom. Each pattern of apertures includes the central aperture for receiving the semiconductor chip 6 and the outer-lead apertures for effecting outer lead bonding, which are separated from the central aperture by a square-ring-shaped lead supporting portion 3 of the tape carrier.

The semiconductor chip 6, such as integrated circuits or transistors has formed on a main surface thereof a plurality of bumps 6a, i.e. projecting electrodes for outer connection, which are bonded to the associated inner lead portions 4a of the leads 4 in the inner lead bonding process which is effected before the outer lead bonding process.

The outer lead bonding of the chips 6 to a lead frame 5 is effected by the device of FIG. 3 as follows. First, the portion of the lead frame 5 to which the leads 4 are bonded in the outer lead bonding process is positioned on the bonding stage 1. Next, a pattern of leads supported by the lead supporting portion 3 of the tape carrier and bonded to the chip 6 in a previous inner lead bonding process is cut out and aligned with the inner lead portions 5a of the leads of the lead frame 5 on the stage 1. The exact alignment can be effected, for example, by a pattern recognition device. Thus, the chip 6 is positioned on the die pad 5b of the lead frame to be bonded therewith, and the outer lead portions 4b of the leads are aligned with associated inner lead portions 5a of the leads of the lead frame 5. When the leads are aligned as described above, the projections 1a are positioned under the lead supporting portions 3 of the tape carrier to support them from below. When leads 4 are thus in exact alignment with the lead frame 5, the bonding tools 2 are lowered to press and heat the outer lead portions 4b of the leads together with the underlying inner lead portions 5a of the leads of the lead frame 5 against the bonding stage 1. Thus, the outer lead portions 4b of the leads 4 are bonded to the inner lead portions 5a of the leads of the lead frame by the thermocompression method. Namely, the outer lead portions 4b are generally plated with tin, and the inner lead portions 5a of the leads of the lead fame 5 are generally plated with a solder alloy of lead and tin or with silver. Thus, tin-lead/tin or tin-silver bonding is formed therebetween. Because the middle portions of the leads 4 are supported by the projections 1a of the stage 1 from below through a portion 3 of the carrier tape when the tools 2 are lowered against the outer lead portions 4b of the leads 4, the leads 4 are formed and bent into a form of a step having a level drop G simultaneously with the outer lead bonding.

Thus, the device according to the present invention has following advantages, as exemplified by the device of FIG. 3. Namely, it becomes unnecessary to form the lead in a separate and independent step before the outer lead bonding process proper. Thus, the efficiency of the process is much increased. Further, because the middle portions of the leads 4 are supported by the projections 1a through the lead supporting portion 3 of the tape carrier, there is no danger of an occurrence of short circuits due to the contacts of the inner lead portions 4a with the surface or an edge of the semiconductor chip 6. Further advantage of the device of the present invention is that an adequate slackening can be given to the middle portions of the leads 4 supported by the carrier tape portion 3 between the inner lead portion 4a and the outer lead portions 4b of the leads 4.

Figure 4A:
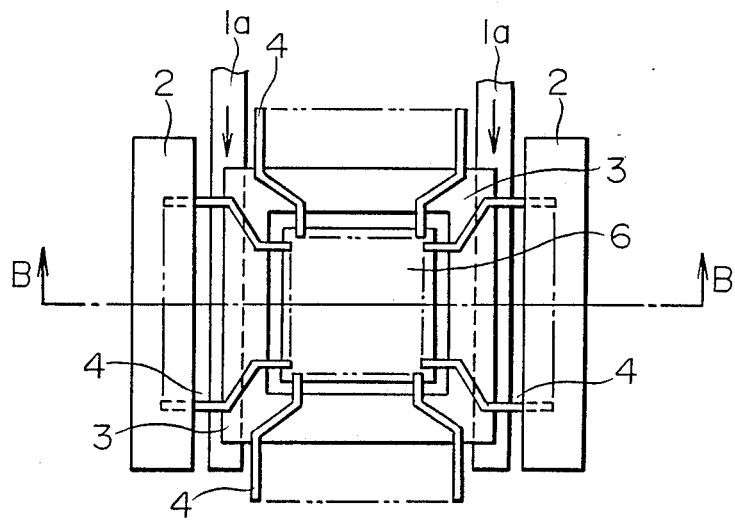
FIG. 4(a) is a plan view of another bonding device according to the present invention, showing the device effecting the outer lead bonding process in which a semiconductor chip is bonded to a substrate of a printed circuit.

Referring now to FIGS. 4(a) and (b) of the drawings, a second embodiment of the present invention is described.

The device of FIGS. 4(a) and (b) has a structure similar to that of the device of FIG. 3 and comprises a bonding stage 1 and a pair of bonding tools 2. However, as the lead supporting means for supporting the lead supporting portion 3 of the tape carrier, a pair of horizontally extending rectangular columns 1a which are retractably insertable into respective spaces between the lead supporting portion 3 of the tape carrier and the upper surface of the stage 1, sliding on the upper surface of the bonding stage 1. The direction of the movement of the rectangular columns 1a coincides with the longitudinal directions thereof. Except that the rectangular columns 1a are provided instead of the projections 1a, the device of FIGS. 4(a) and (b) is constructed similarly to that of FIG. 3.

Figure 4B:
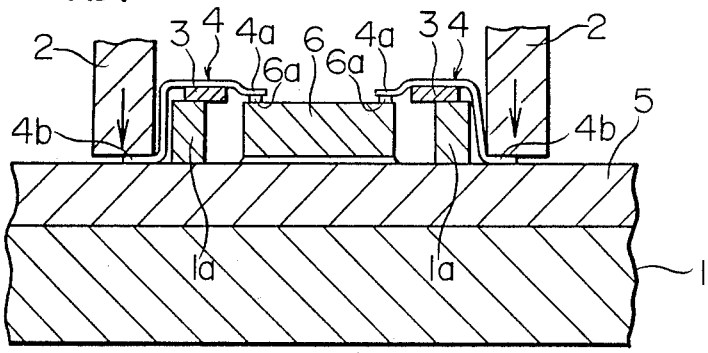
FIG. 4(b) is a view similar to that of FIG. 1, but showing the bonding device of FIG. 4(b) effecting the outer lead bonding process in which a semiconductor chip is bonded to a substrate of a printed circuit.

The outer lead bonding of semiconductor chips is effected by the device of FIGS. 4(a) and (b) in a way similar to that in which it is effected by the device of FIG. 3, utilizing the rectangular columns 1a instead of the projections 1a of the device of FIG. 3 as the lead supporting and forming means for supporting the lead supporting portion 3 of the tape carrier. FIG. 4(b), however, shows the case in which the outer lead portion 4b. of the leads 4 are bonded to the substrate 5 of a printed circuit for assembling a hybrid integrated circuit.

As the device of FIGS. 4(a) and (b) is constructed and operated similarly to the device of FIG. 3, as explained above, further description of the device of FIGS. 4(a) and (b) is deemed unnecessary.

Figure 5:
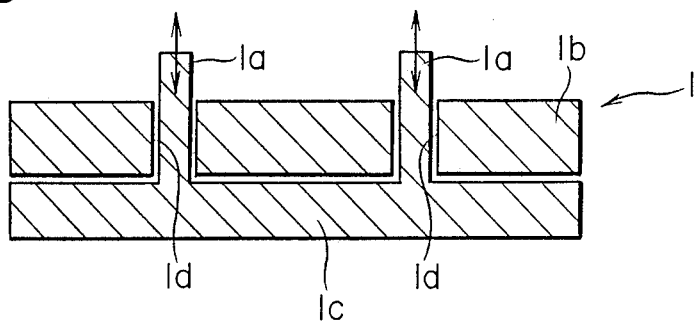
FIG. 5 is an elevational sectional view of a modification of the bonding stage of the bonding device of FIG. 3.

FIG. 5 shows a modification of the bonding stage 1 of the device of FIG. 3. The bonding stage 1 shown in FIG. 5 is divided into two plate-shaped members 1b and 1c. Upper or main stage 1b of the bonding stage 1 has a pair of through holes 1d extending vertically at horizontal locations corresponding to those of the projections 1a of the bonding stage 1 of the device of FIG. 3. The lower or accessary stage 1c of the bonding stage 1 has a pair of projections 1a in alignment with the through holes 1d of the main stage 1b, so that the projections 1a that are slidably inserted in associated holes 1d can be retractably raised to the same height as that of the projections 1a of the device of FIG. 3 by the controlled vertical movement of the accessary stage 1c.

Although the present invention has been described above referring to particular embodiments thereof, it is not limited thereto and may be modified in a variety of ways without departing from the scope and spirit of the present invention. For example, the form and the structure of the bonding stage, the bonding tools, and the projections or the horizontally extending rectangular columns, which embody the lead supporting and forming means of the present invention, may be modified in many ways; those of the semiconductor chips, carrier tapes, and the connection member such as the lead frame or the substrate, which are utilized in the outer lead bonding effected by the device of present invention, may also be modified in a variety of ways.

What is claimed is:

1. A device for effecting outer lead bonding of semiconductor chips to a plate-shaped connection member, utilizing a flexible tape carrying patterns of leads and the semiconductor chips bonded to inner lead portions of said leads, comprising:

a bonding stage having an upper surface means for supporting said connection member during the outer lead bonding;

a bonding tool disposed above said upper surface means of said bonding stage at a horizontal location at which outer lead portions of said leads are bonded to said connection member during the outer lead bonding, said bonding tool being vertically movable to be lowered and pressed against said outer lead portions situated above the connection member during the outer lead bonding process; and lead supporting and forming means for supporting at a predetermined height from said upper surface means of the bonding stage a portion of said tape supporting said leads when said bonding tool is lowered during the outer lead bonding, thereby effecting lead forming simultaneously with the outer lead bonding.

2. A device for effecting outer lead bonding of semiconductor chips as claimed in claim 1, wherein said connection member is a lead frame.

3. A device for effecting outer lead bonding of semiconductor chips as claimed in claim 1, wherein said connection member is a substrate of a printed circuit.

4. A device for effecting outer lead bonding of semiconductor chips as claimed in claim 1, wherein said lead supporting and forming means comprises a projection projecting from said upper surface means of the bonding stage at a horizontal location thereof at which said portion of the tape supporting the leads are situated when the bonding tool is lowered during the outer lead bonding.

5. A device for effecting outer lead bonding of semiconductor chips as claimed in claim 1, wherein said lead supporting and forming means comprises a horizontally extending column slidable on said upper surface means of the bonding stage in a longitudinal direction to and from a horizontal location on said upper surface means of the bonding stage at which said portion of the tape supporting the leads are situated when the bonding tool is lowered during the outer lead bonding.

6. A device for effecting outer lead bonding of semiconductor chips as claimed in claim 1, wherein said bonding stage has formed therein a through hole extending vertically at a horizontal location at which said portion of the tape supporting the leads are situated when the bonding tools is lowered during the outer lead bonding, and said lead supporting and forming means comprises a member vertically slidable in said through hole to retractably project to a predetermined height above said upper surface means of the bonding stage.

* * * * *